(12) United States Patent
Boni et al.

(10) Patent No.: US 12,043,540 B2
(45) Date of Patent: Jul. 23, 2024

(54) MICRO-ELECTRO-MECHANICAL DEVICE WITH A SHOCK-PROTECTED TILTABLE STRUCTURE

(71) Applicant: STMicroelectronics S.r.l., Agrate Brianza (IT)

(72) Inventors: Nicolo' Boni, Mountain View, CA (US); Roberto Carminati, Piancogno (IT); Massimiliano Merli, Pavia (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 18/134,381

(22) Filed: Apr. 13, 2023

(65) Prior Publication Data

US 2023/0249960 A1    Aug. 10, 2023

Related U.S. Application Data

(63) Continuation of application No. 17/126,929, filed on Dec. 18, 2020, now Pat. No. 11,655,140.

(30) Foreign Application Priority Data

Dec. 20, 2019   (IT) ........................ 102019000025084

(51) Int. Cl.
*B81B 3/00*       (2006.01)
*G02B 26/08*      (2006.01)
(Continued)

(52) U.S. Cl.
CPC .......... *B81B 3/0072* (2013.01); *B81B 3/0021* (2013.01); *G02B 26/0858* (2013.01);
(Continued)

(58) Field of Classification Search
CPC ............ G02B 26/0816; G02B 26/0833; G02B 26/0841; G02B 26/101; G02B 26/357;
(Continued)

(56) References Cited

U.S. PATENT DOCUMENTS 7,529,016 B1    5/2009  Allen et al.
9,856,133 B2 *  1/2018  Boillot ...................... B81B 7/02
(Continued)

FOREIGN PATENT DOCUMENTS

CN    101029966 A    9/2007
CN    101239698 A    8/2008
(Continued)

OTHER PUBLICATIONS

IT Search Report and Written Opinion for IT Appl. No. 102019000025084 dated Sep. 17, 2020 (8 pages).
(Continued)

*Primary Examiner* — Sultan Chowdhury
(74) *Attorney, Agent, or Firm* — Crowe & Dunlevy LLC

(57) ABSTRACT

This disclosure pertains to a microelectromechanical systems (MEMS) device with a tiltable structure, a fixed supporting structure, and an actuation structure with driving arms connected to the tiltable structure by elastic decoupling elements. Described herein, particularly, is a planar stop structure between the driving arms and the tiltable structure, which functions to limit movement in the tiltable plane. This stop structure includes a first projection/abutment surface pair formed by a projection extending from a driving arm and an abutment surface formed by a recess in the tiltable structure. The projection and abutment surface are adjacent and spaced apart in the device's rest condition.

21 Claims, 7 Drawing Sheets

(51) Int. Cl.
*G03B 21/00* (2006.01)
*H04N 9/31* (2006.01)
*H10N 30/20* (2023.01)

(52) U.S. Cl.
CPC ......... *G03B 21/008* (2013.01); *H04N 9/3152* (2013.01); *H10N 30/20* (2023.02); *B81B 2201/042* (2013.01)

(58) Field of Classification Search
CPC ............ G02B 26/3518; G02B 26/3584; G02B 26/001; B81B 3/00; B81B 3/004; B81B 3/0021; B81B 3/0072; G03B 21/005; G03B 21/008; G03B 21/28; G03B 21/145; G03B 21/2013; G03B 21/2033; G03B 21/2053; G03B 21/2066; H01L 41/08; H01L 41/0805; H01L 41/081; H01L 41/082; H01L 41/09; H01L 41/0906; H04N 9/315; H04N 9/3129; H04N 9/3141; H04N 9/3152; H04N 9/3155; H04N 9/3161; H04N 9/3164
See application file for complete search history.

(56) References Cited

U.S. PATENT DOCUMENTS

| | | |
|---|---|---|
| 2002/0118472 A1 | 8/2002 | Hill |
| 2008/0278785 A1 | 11/2008 | Klose et al. |
| 2009/0017579 A1 | 1/2009 | Jeong et al. |
| 2010/0172612 A1* | 7/2010 | Moidu .................. B81B 3/0062 359/199.2 |
| 2011/0292479 A1 | 12/2011 | Hiraoka et al. |
| 2013/0120819 A1 | 5/2013 | Rothaar et al. |
| 2015/0033849 A1 | 2/2015 | Hanson et al. |
| 2016/0231557 A1 | 8/2016 | Lemaire et al. |
| 2017/0080641 A1* | 3/2017 | El-Siblani .............. B33Y 30/00 |
| 2017/0108530 A1 | 4/2017 | Tocchio et al. |
| 2017/0205624 A1* | 7/2017 | Naono .................. B81B 3/0043 |
| 2018/0180871 A1* | 6/2018 | Costantini .......... G02B 26/0833 |
| 2018/0314059 A1 | 11/2018 | Yamada |
| 2019/0064508 A1 | 2/2019 | Torkkeli et al. |
| 2019/0327562 A1 | 10/2019 | Cerini et al. |
| 2020/0132981 A1 | 4/2020 | Van Lierop et al. |
| 2020/0249467 A1 | 8/2020 | Grutzeck et al. |

FOREIGN PATENT DOCUMENTS

| | | |
|---|---|---|
| CN | 206126835 U | 4/2017 |
| CN | 106809796 A | 6/2017 |
| CN | 110510567 A | 11/2019 |
| CN | 214795413 U | 11/2021 |
| DE | 102017223638 A1 | 6/2019 |
| KR | 100773535 B1 | 11/2007 |
| WO | 2013055210 A1 | 4/2013 |
| WO | 2019077063 A1 | 4/2019 |

OTHER PUBLICATIONS

First Office Action and Search Report for family-related CN Appl. No. 202011519697.5, report dated Aug. 1, 2022, 17 pgs.
Search Report for Notice of Grant for counterpart CN Appl. No. 202011519697.5, report dated Jul. 12, 2023, 4 pgs.

* cited by examiner

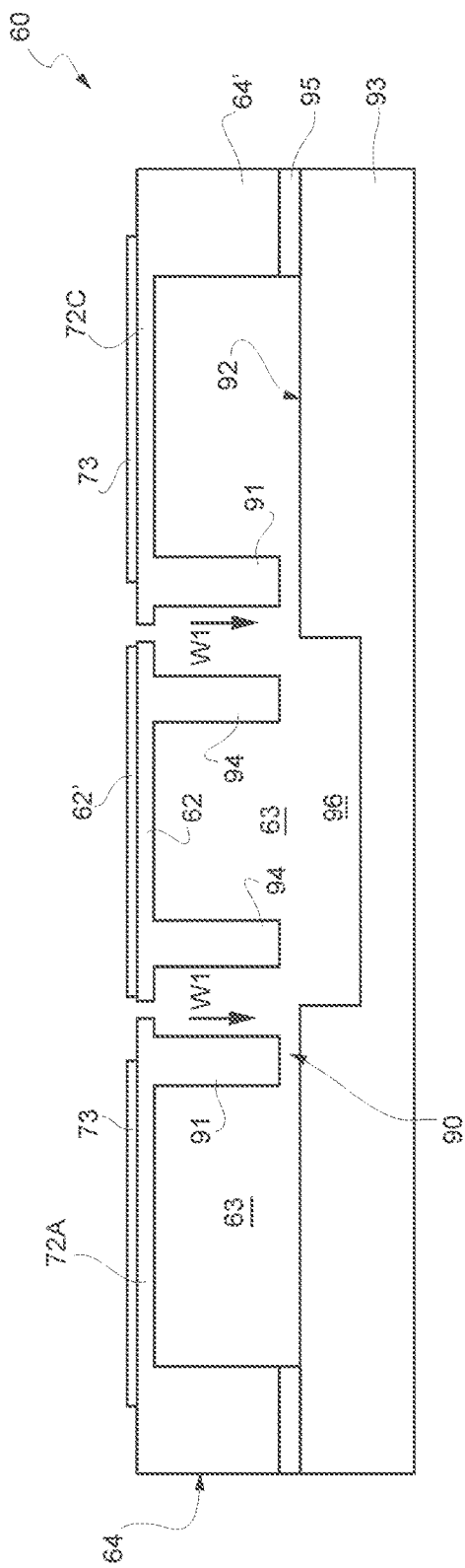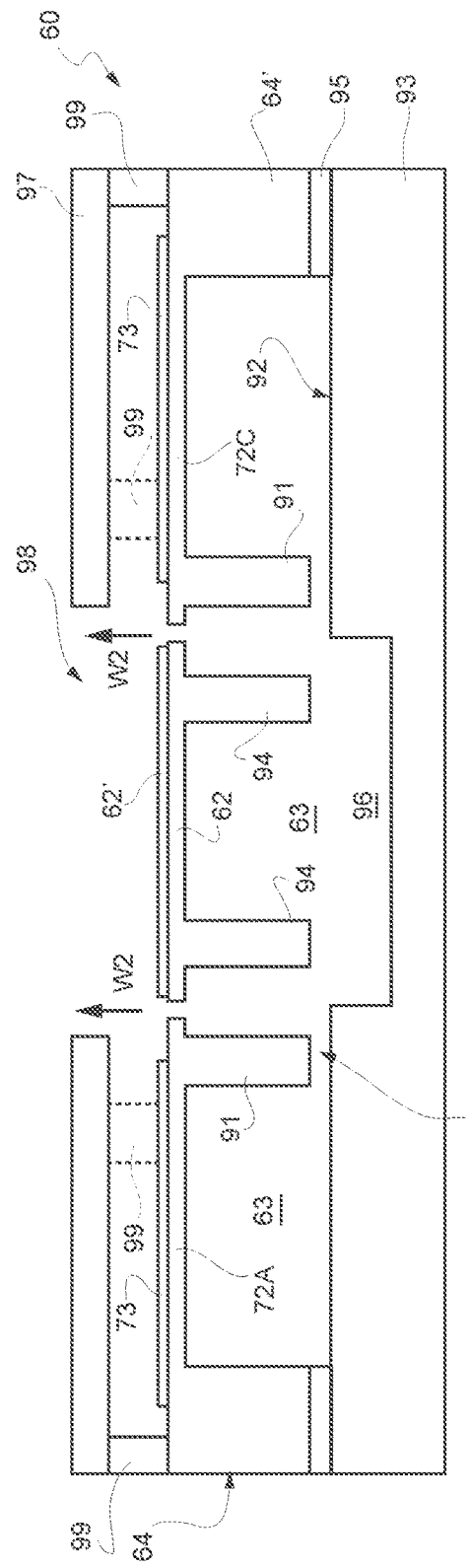

MICRO-ELECTRO-MECHANICAL DEVICE WITH A SHOCK-PROTECTED TILTABLE STRUCTURE

RELATED APPLICATION

This application is a continuation of U.S. application patent Ser. No. 17/126,929, filed on Dec. 18, 2020, which claims the priority benefit of Italian Application for Patent No. 102019000025084, filed on Dec. 20, 2019, the contents of which are hereby incorporated by reference in their entireties to the maximum extent allowable by law.

TECHNICAL FIELD

This disclosure relates to a micro-electro-mechanical device with a shock-protected tiltable structure.

BACKGROUND

In particular, reference will be made hereinafter, without any loss of generality, to a micro-electro-mechanical mirror device (manufactured using MEMS, Micro-Electro-Mechanical System, technology), wherein the tiltable structure has a reflecting surface.

As is known, micro-electro-mechanical mirror devices are used in portable apparatuses, such as, for example, smartphones, tablets, notebooks, PDAs, and other apparatuses with optical functions, in particular for directing light beams generated by a light source with desired modalities, for projecting images at a distance, in miniaturized projectors (so-called picoprojectors), and in enhanced-reality apparatuses. By virtue of the small dimensions, in fact, micro-electro-mechanical devices are able to meet stringent requirements regarding costs and bulk, both in terms of area and thickness.

Micro-electro-mechanical mirror devices generally include a mirror structure, manufactured from a semiconductor material body and elastically supported over a cavity to be movable, for example with a tilting or rotating movement out of a corresponding main extension plane, for directing the incident light beam in a desired way.

Typically, in the considered applications, deflection of the light beam along two axes is provided, and may be obtained by two uniaxial micro-electro-mechanical mirror devices, or by a single biaxial micro-electro-mechanical mirror device.

Hereinafter, reference will be made to a first design, with two uniaxial micro-electro-mechanical mirror devices, as illustrated in FIG. 1 for better understanding, and the following also applies to a biaxial mirror structure, as will be evident to the person skilled in the art.

In detail, FIG. 1 schematically shows a picoprojector 1 comprising a light source 2, typically a laser source, which generates a light beam that is deflected by a system of mirrors 3 toward a screen 4.

In particular, the system of mirrors 3 comprises a first mirror device 3A, of uniaxial type, driven so as to rotate about an axis A with resonant movement, for generating a fast horizontal scan; and a second mirror device 3B, also of uniaxial type, driven so as to rotate about a second axis B with linear or quasi-static movement (i.e., at a frequency much lower than the frequency of the resonant movement), for generating a slow vertical scan.

In practice, the first mirror device 3A forms a horizontal mirror device, and the second mirror device 3B forms a vertical mirror device; they cooperate for generating a scanning scheme, designated schematically by 5 in FIG. 1, on the screen 4.

Rotation of the vertical mirror device is controlled by an actuation system that may be of electrostatic, electromagnetic, or piezoelectric type.

Electrostatic actuation systems in general require high operating voltages, whereas electromagnetic actuation systems in general involve a high-power consumption.

Actuation systems of a piezoelectric type are therefore spreading into wide usage.

For instance, in the mirror device described in United States Patent Application Publication No. 20110292479 (incorporated by reference), a suspended frame carrying a mirror surface is connected to a fixed structure via spring elements having a serpentine shape formed by a plurality of mutually parallel arms arranged side-by-side. Each arm carries a piezoelectric band, and adjacent piezoelectric bands are biased by voltages of opposite polarity. Due to the properties of piezoelectric materials, biasing causes the deformation in opposite directions (upwards and downwards) of adjacent arms and the consequent rotation of the suspended frame in a first direction about the horizontal axis B. By applying an opposite biasing, rotation of the frame in a second direction, opposite to the first, is obtained. The vertical scan may therefore be obtained by applying a.c. bipolar voltages to the arms.

Another mirror device with piezo-electric actuation is described in United States Patent Application Publication No. 20200192199 (incorporated by reference) corresponding to Italian patent application N. 102018000011112 (incorporated by reference), filed on 14 Dec. 2018, corresponding to European patent application N. 19165958.0 (incorporated by reference), filed on 28 Mar. 2019, and includes an embodiment illustrated in FIG. 2. Here, the mirror device, designated by 20, has a tiltable structure 22 carrying a reflecting surface 22' and suspended over a cavity 23. The tiltable structure 22 is elastically coupled to a frame 24' belonging to a fixed structure 24 via supporting elements 25A, 25B and elastic suspension elements 26A, 26B. The tiltable structure 22 is rotatable about a rotation axis corresponding, for example, to the horizontal axis B of the picoprojector 1 of FIG. 1 and therefore designated once again by B.

The tiltable structure 22 is coupled to an actuation structure 30 comprising two pairs of driving arms 32A-32D, each carrying a respective piezoelectric region 33. The driving arms 32A-32D of each pair are coupled on opposite sides of the rotation axis B (which is here parallel to a first axis X of a Cartesian reference system XYZ) by respective elastic decoupling elements 34A-34D. The elastic decoupling elements 34A-34D are rigid to movements of the tiltable structure out of the tiltable plane defined by the mirror surface (plane AB) and are compliant to torsion about the rotation axis B.

In the mirror devices of the type considered, due to the presence of suspended and mobile parts, robustness and resistance to shocks are desired, particularly in directions perpendicular to the rotation axis B (directions parallel to a second and a third axis Y and Z of the Cartesian reference system XYZ of FIG. 2). In fact, uniaxial mirror devices are generally rather rigid in a direction parallel to the rotation axis B (i.e., to the first axis X), but shocks in a direction parallel to the second or third axes Y, Z may cause sharp movements of the tiltable structure 22 along these directions, with possible damage to, and even breakage of, the elastic decoupling elements 34A-34D, which are rigid in these directions, thus jeopardising functionality of the mirror device.

To prevent excessive movements of the tiltable structure in directions perpendicular to the rotation axis, stop elements may be arranged between the tiltable structure and the fixed supporting structure.

However, this approach only operates properly for shocks and stresses applied to the mirror device when it is in a rest position and does not offer protection when the tiltable structure is rotated.

There is accordingly a need in the art to provide a micro-mechanical device that has high robustness to shocks.

SUMMARY

A microelectromechanical systems (MEMS) device disclosed herein features a tiltable structure that has a main extension in a tiltable plane parallel to an XY plane of a Cartesian reference system with an X axis, a Y axis, and a Z axis. The device also includes a fixed supporting structure, at least one elastic decoupling element connecting the tiltable structure to a first driving arm, and an actuation structure formed by multiple driving arms coupled to the tiltable structure by respective elastic decoupling elements. A planar stop structure is arranged between the driving arms and the tiltable structure to limit movement of the tiltable structure in the tiltable plane in a direction perpendicular to a rotation axis, parallel to the X axis and belonging to the tiltable plane.

The planar stop structure has a first projection/abutment surface pair formed by a first projection extending from a first driving arm and a first abutment surface formed by a first recess extending from the periphery of the tiltable structure toward its inside. The free end of the first projection extends within the first recess. The first projection and the first abutment surface extend in a direction transverse to a symmetry axis, parallel to the Y axis, and are arranged adjacent and side-by-side to one another. In a rest condition of the MEMS device, they are arranged at a distance from each other.

The planar stop structure also includes a second projection/abutment surface pair between a second driving arm and the tiltable structure, a third projection/abutment surface pair between a third driving arm and the tiltable structure, and a fourth projection/abutment surface pair between a second driving arm and the tiltable structure. The tiltable structure is configured to rotate about the rotation axis during operation due to successively alternating biasing of piezoelectric regions of the first and third driving arms to obtain a rotation in one direction and biasing piezoelectric regions of the second and fourth driving arms to obtain a rotation in another direction.

During the rotation of the tiltable structure about the rotation axis due to biasing of the piezoelectric regions of the first and third driving arms, the positioning of the first and third projection/abutment surface pairs limits movement of the tiltable structure parallel to the symmetry axis. Similarly, during the rotation of the tiltable structure about the rotation axis due to biasing of the piezoelectric regions of the second and fourth driving arms, the positioning of the second and fourth projection/abutment surface pairs limits movement of the tiltable structure parallel to the symmetry axis.

The MEMS device includes elastic decoupling elements that are rigid to movements out of the tiltable plane and compliant to torsion about the rotation axis. The first driving arm carries a respective piezoelectric region, and the device features a plurality of electrical-contact pads carried by the fixed structure and electrically connected to the piezoelectric region. This enables electrical biasing of the piezoelectric region by electrical signals from outside the MEMS device.

The first projection extends from a driving arm toward the tiltable structure and has a width along the second axis smaller than the distance between the first and second transverse walls of the recess. The planar stop includes a second pair of planar stop structures formed by a second projection. The MEMS device also features a vertical stop structure perpendicular to the tiltable plane and parallel to the third axis in a rest condition of the tiltable structure.

The vertical stop structure includes stop pillars cooperating with a rear stop surface. These stop pillars project from the rear side of the driving arms toward the inside of the cavity and are rigid with the driving arms. The rear stop surface is formed by a cap structure bonded to the frame of the fixed structure through an adhesive layer.

The tiltable structure has reinforcement elements extending parallel to the third axis toward a recess formed in the cap structure. Both the reinforcement elements and the stop pillars have the same height in a direction parallel to the third axis.

Another MEMS device disclosed herein features a tiltable structure formed in a die of semiconductor material, with a main extension in a tiltable plane and carrying a reflecting surface suspended over a cavity defined in the die. The fixed structure includes a frame, and the tiltable structure is elastically coupled to the frame via supporting elements and elastic suspension elements. The supporting elements extend longitudinally along a rotation axis on opposite sides of the tiltable structure, while the elastic suspension elements extend in proximity of the rotation axis between a respective supporting element and the tiltable structure.

The actuation structure includes first, second, third, and fourth driving arms coupled to the tiltable structure by respective elastic decoupling elements. The first and second driving arms form a first pair arranged on opposite sides of the rotation axis, and the third and fourth driving arms form a second pair arranged symmetrically to the first pair with respect to a symmetry axis. Each driving arm carries a piezoelectric region for enabling electrical biasing by electrical signals from outside the MEMS device. A planar stop structure is arranged between the driving arms and the tiltable structure for limiting movement of the tiltable structure in the tiltable plane in a direction perpendicular to the rotation axis.

The planar stop structure includes a first pair of stop features, with one element projecting from or fixed to a respective driving arm and the other element fixed to or projecting from the tiltable structure. The first pair of stop features include a first projection extending from the first driving arm and a first abutment surface formed by a recess defined in the tiltable structure. The first projection extends within the first recess, and the first recess is defined by first and second transverse walls parallel to the rotation axis and spaced from each other by a gap allowing movement between the first projection and the first recess along the symmetry axis.

In a rest condition of the tiltable structure, the first projection and the first transverse wall are arranged at a distance d1, and the first projection and the second transverse wall are arranged at a distance d2. The distance L between the first and second transverse walls is defined as L=L1+d1+d2, with L1 being the width of the first projection.

The elastic suspension elements include straight springs formed by thinned portions of the supporting elements. Each driving arm has a generically trapezial shape, with a major base fixedly coupled to the frame of the fixed structure and a minor base elastically coupled to the tiltable structure.

BRIEF DESCRIPTION OF THE DRAWINGS

For a better understanding of the present invention, embodiments thereof are now described purely by way of non-limiting example, with reference to the attached drawings, wherein:

FIG. 6 is a cross-sectional view of the device of FIG. 5, taken along section line VI-VI of FIG. 4;

FIG. 7 is a cross-sectional view similar to FIG. 6 for a different embodiment of the device of FIG. 4;

DETAILED DESCRIPTION

Figure 3:
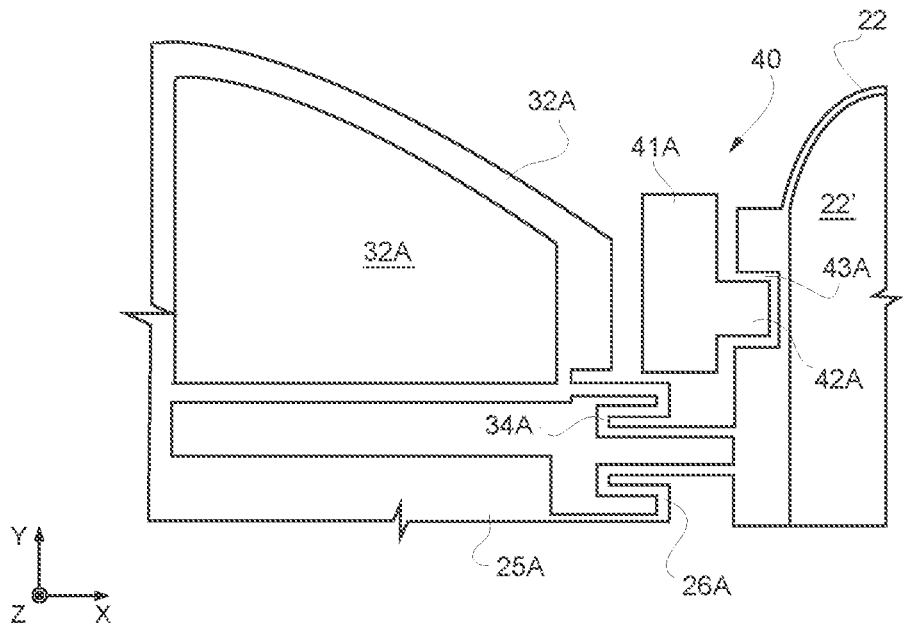
FIG. 3 is a top view of an enlarged detail of a uniaxial mirror device having the general structure of the device of FIG. 2 and modified to form shock-protection structures, in the rest position.

FIG. 3 shows a possible embodiment of the micro-electro-mechanical device 20 for manufacturing a shock-protection structure formed like structures provided in known micro-electro-mechanical acoustic sensors and transducers.

Specifically, the micro-electro-mechanical device of FIG. 3, designated once again by 20 and of which only a portion at the elastic connection between the first driving arm 32A and the tiltable structure 22 is illustrated, has a stop structure 40 between the tiltable structure 22 and the fixed supporting structure 24.

In detail, the stop structure 40 has a stop column 41, which extends, for example, from a substrate underneath the tiltable structure 22 (not visible) through the cavity 23 in a vertical direction (parallel to the third axis Z) and projects, in the tiltable plane AB, in an intermediate position between the first driving arm 32 and the tiltable structure 22, laterally with respect to the first elastic decoupling element 34A.

The stop column 41 has a fixed projection 42A, extending within a respective recess 43A formed on the periphery of the tiltable structure 22. The fixed projection 42A, here having a rectangular shape in top view, like the recess 43A, has dimensions (in particular, a width in a direction parallel to the second Cartesian axis Y) smaller than those of the recess 43A. In order not to hinder rotation of the tiltable structure 22, the fixed projection 42A has the same thickness (in a direction parallel to the third axis Z) as the tiltable structure 22. In the rest position of the micro-electro-mechanical device 20 (when the tiltable structure 22 is not rotated and the tiltable plane AB is parallel to the plane XY of the Cartesian reference system XYZ), the fixed projection 42A and the tiltable structure 22 have coplanar top and bottom surfaces, and the fixed projection 42a extends within the walls of the recess 43A at a distance therefrom.

Consequently, the stop structure 40 enables free rotation of the tiltable structure 22 and, in a rest condition and in presence of direct shocks parallel to the second axis Y, the displacement of the tiltable structure 22 in this direction is stopped and limited by contact between the recess 43A and the fixed projection 42A, thus also limiting the stress applied to the elastic decoupling element 34A.

Figure 2:
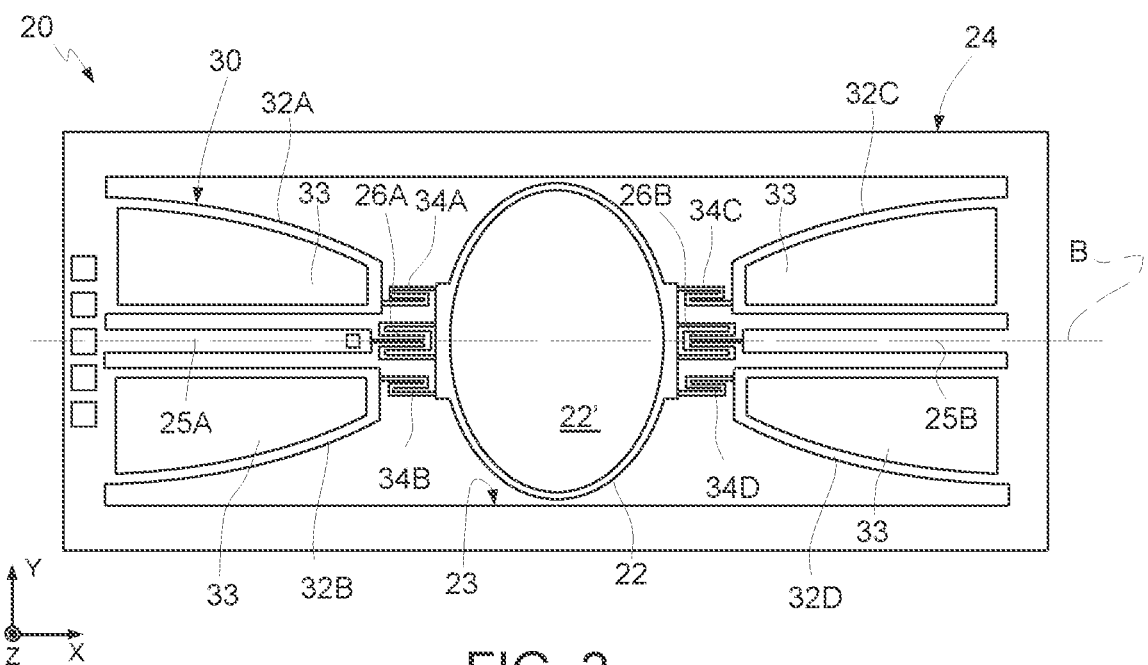
FIG. 2 is a schematic top view of a uniaxial mirror device.

Similar stop structures may be provided in proximity of the elastic decoupling elements 34B-34D of FIG. 2.

Figure 3A:
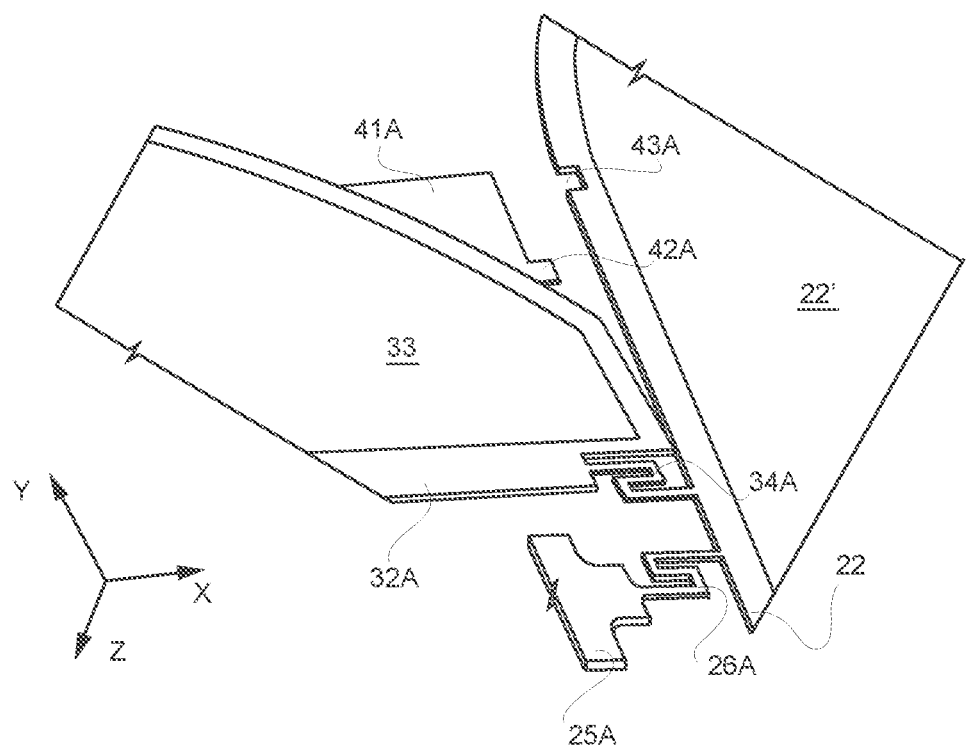
FIG. 3A is an enlarged perspective view of the detail of FIG. 3, with the tiltable structure in a rotated position.

The stop structure 40 operates properly if the tiltable structure 22 is not rotated at all or is rotated only by a small angle. However, when rotation of the tiltable structure 22 exceeds a preset angle, which depends upon the geometry of the micro-electro-mechanical device 20, the fixed projection 42A may no longer face and remain inside the recess 43A, as illustrated, for example, in the enlarged detail of FIG. 3A, where the tiltable structure 22 is rotated in a clockwise direction, as indicated by the arrow R, and the fixed projection 42A is lower than the tiltable structure 22 and therefore outside the recess 43A.

Therefore, in this situation, the stop structure is not effective and, in presence of shocks directed parallel to the second axis Y, the tiltable structure 22 may undergo a major displacement and jeopardize the integrity of the elastic decoupling elements 34A-34D.

A similar situation may arise for shocks or forces acting parallel to the third axis Z.

Figure 4:
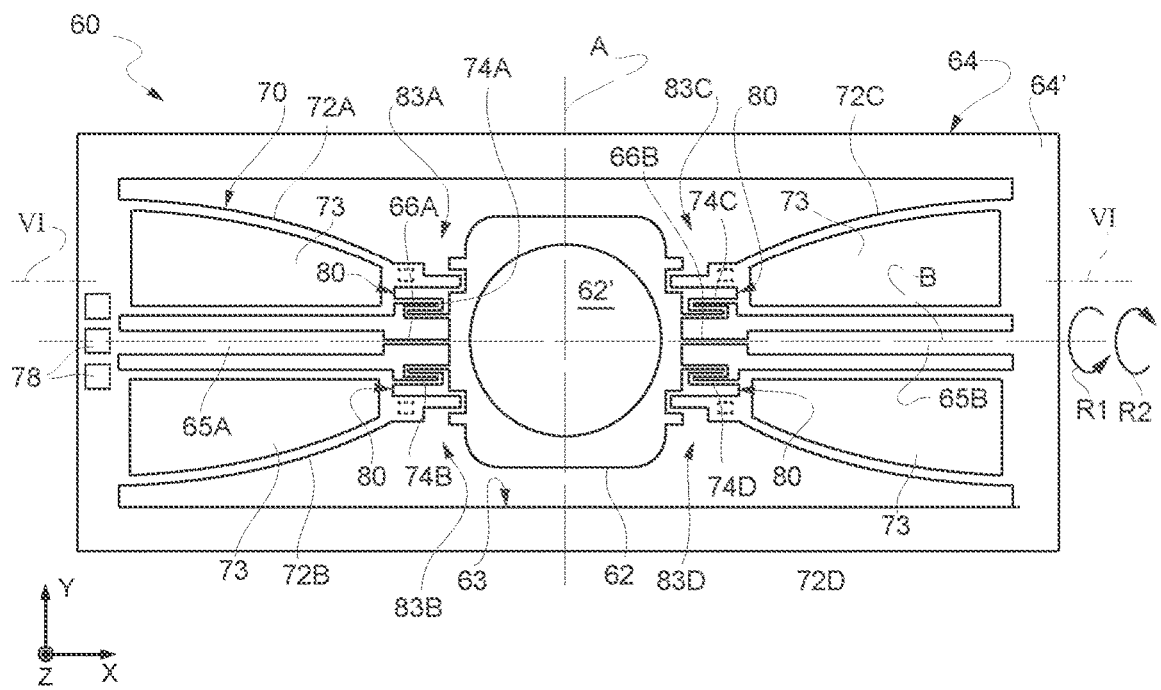
FIG. 4 is a schematic top view of an embodiment of the uniaxial mirror device described and disclosed herein.

FIG. 4 shows an embodiment of a micro-electro-mechanical device disclosed and described herein, designated by reference 60, which solves the above problem.

The micro-electro-mechanical device 60 has a general structure similar to the micro-electro-mechanical device 20, but contains numerous improvements; the parts in common with the micro-electro-mechanical device 20 are designated in FIG. 4 by numbers increased by 40.

In detail, the micro-electro-mechanical device 60 is formed in a die of semiconductor material, in particular silicon, and has a tiltable structure 62. The tiltable structure 62 has a main extension in a plane (hereinafter referred to as tiltable plane AB), which, in a rest position of the micro-electro-mechanical device 60, is parallel to a plane XY of a system of Cartesian coordinates XYZ (the axes thereof are referred to hereinafter as first Cartesian axis X, second Cartesian axis Y, and third Cartesian axis Z). Thus, in the following description, the thickness of the tiltable structure 62 will be neglected, except where explicitly indicated.

Figure 1:
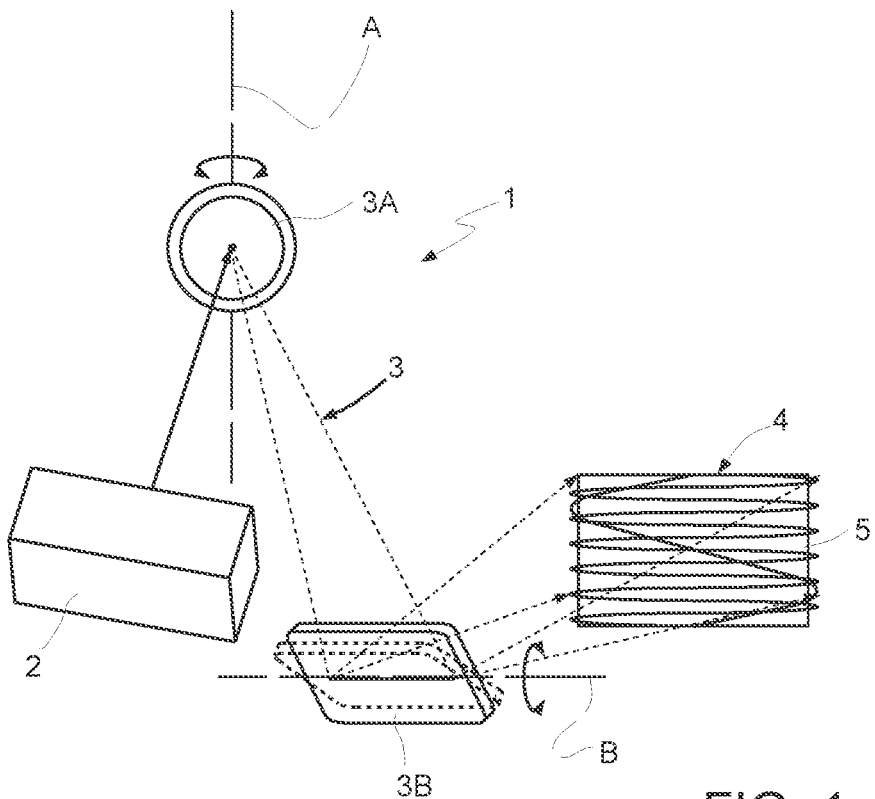
FIG. 1 is a schematic representation of a known picoprojector having a pair of uniaxial mirror devices.

Consequently, based on the above, the tiltable structure 62 is arranged so as to rotate about a rotation axis parallel to the first Cartesian axis X, belonging to the tiltable plane AB and corresponding, for example, to the horizontal axis B of the picoprojector apparatus of FIG. 1 (and therefore designated once again by B). The tiltable structure 62 (substantially like other parts of the micro-electro-mechanical device 60) is symmetrical with respect to both the rotation axis B and to a further axis, referred to hereinafter as symmetry axis A, here parallel to the second Cartesian axis Y.

The tiltable structure 62 carries a reflecting surface 62', is suspended over a cavity 63 of the die, and is elastically coupled to a frame 64' belonging to a fixed structure 64 via supporting elements 65A, 65B and elastic suspension elements 66A, 66B.

In detail, the supporting elements 65A, 65B extend longitudinally along the rotation axis B, on opposite sides of the tiltable structure 62.

The elastic suspension elements 66A, 66B, which have a high stiffness to movements out of the tiltable plane AB (along the third Cartesian axis Z, transverse to the tiltable plane AB) and are compliant to torsion about the rotation axis B, extend in proximity of the rotation axis B between a respective suspension element 65A, 65B and the tiltable structure 62. In the illustrated embodiment, the elastic suspension elements 66A, 66B comprise straight springs, formed by thinned portions of the supporting elements 65A, 65B, but they could be of a folded type having the main extension parallel to the rotation axis B.

The micro-electro-mechanical device 60 further comprises an actuation structure 70 formed by four driving arms 72A-72D (hereinafter also referred to as first driving arm 72A, second driving arm 72B, third driving arm 72C, and fourth driving arm 72), coupled to the tiltable structure 62 by respective elastic decoupling elements 74A, 74B, 74C and 74D. The first and second driving arms 72A, 72B form a first pair of driving arms and are arranged on opposite sides of the rotation axis B; the third and fourth driving arms 72C, 72D form a second pair of driving arms and are arranged on opposite sides of the rotation axis B, symmetrically to the first pair of driving arms 72A, 72B with respect to the symmetry axis A.

Each driving arm 72A-72D carries a respective piezoelectric region 73, for example, of PZT (lead zirconate titanate) and, in the embodiment of FIG. 4, has a generically trapezial (or fin-like) shape, with the large base fixedly coupled to the frame 64' of the fixed structure 64 and the minor base (designated by 80 in FIG. 4) elastically coupled to the tiltable structure 62.

The elastic decoupling elements 74A-74D are rigid to movements out of the tiltable plane AB and are compliant to torsion about rotation axis B.

A plurality of electrical-contact pads 78 are carried by the fixed structure 64 along the frame 64' and are electrically connected (in a way not illustrated in detail in FIG. 4) to the piezoelectric regions 73, to enable electrical biasing thereof by electrical signals from outside the electro-mechanical device 60 (for example, supplied by a biasing device of an electronic apparatus into which the electro-mechanical device 60 is integrated), as discussed below.

The micro-electro-mechanical device 60 further comprises a planar stop structure arranged between the driving arms 72A-72D and the tiltable structure 62 for limiting movement of the latter in the tiltable plane AB in a direction perpendicular to the rotation axis B (i.e., in a direction parallel to the symmetry axis A).

Specifically, the planar stop structure comprises at least a first pair formed by a projection and an abutment surface, wherein a first element of the first pair (the projection or the abutment surface) projects from or is fixed to a driving arm 72A-72D, and the other element of the first pair (the abutment surface or the projection, respectively) is fixed to, or projects from, the tiltable structure 62, and the projection and the abutment surface extend in a direction transverse to the symmetry axis A, are arranged adjacent to and side-by-side, and, in a rest condition of the micro-electro-mechanical device 60, are arranged at a distance from each other.

Figure 5:
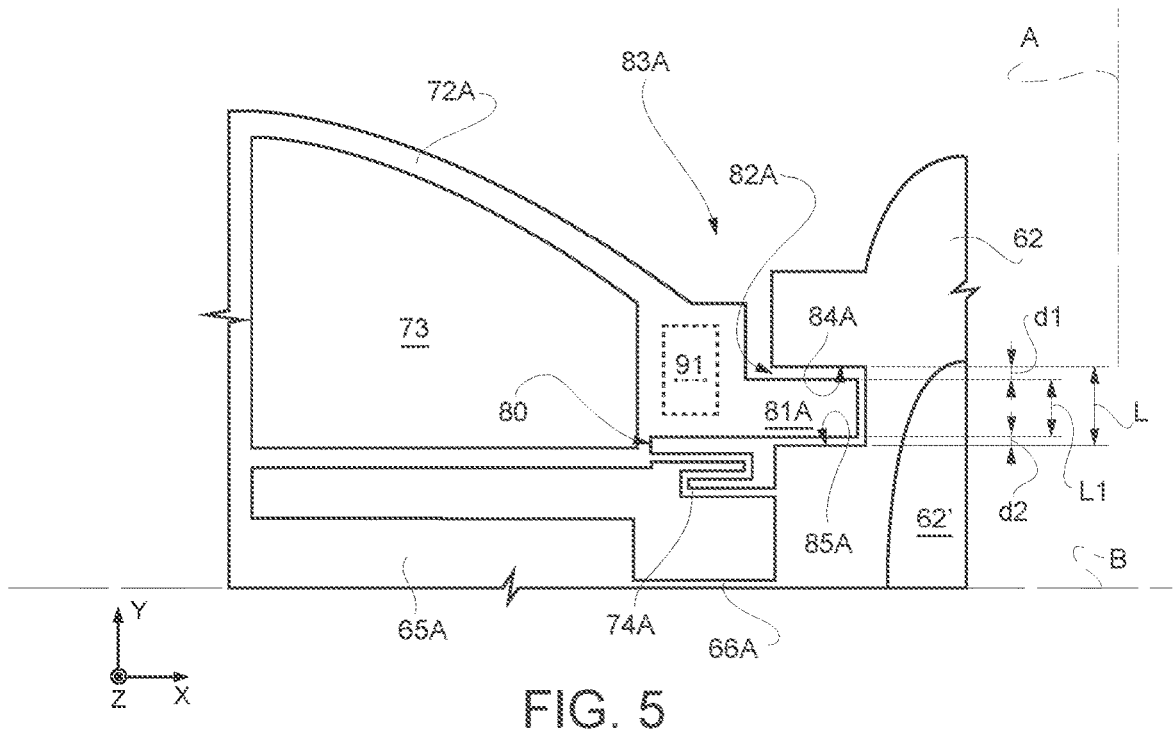
FIG. 5 is a top view of an enlarged detail of the device of FIG. 4.

In the illustrated embodiment, see also the enlarged detail of FIG. 5, the first projection/abutment surface pair (designated as a whole by 83A) comprises a first projection 81A, extending from the first driving arm 72A of the first pair, and a first abutment surface formed by a recess 82A formed in the tiltable structure 62. In particular, the first projection 81A extends from the inner end of the first driving arm 72A (at the minor base 80 of the trapezial shape) toward the tiltable structure 62, and the first recess 82A extends from the periphery of the tiltable structure 62 toward the inside thereof; moreover, the free end of the first projection 81A extends within the first recess 82A. The first recess 82A comprises a first and a second transverse wall 84A, 85A; both transverse walls 84A, 85A are here parallel to the rotation axis B and are spaced from each other by a gap such as to allow a small relative movement between the first projection 81A and the first recess 82A along the symmetry axis A before the first projection 81A abuts against one of the transverse walls 84A, 85A.

In particular, with reference to FIG. 5, if L is the distance between the transverse walls 84A and 85A, L1 is the width of the projection 81A along the second Cartesian axis Y (in the rest condition of the tiltable structure 62), d1 is the distance between the first projection 81A and the first transverse wall 84A, and d2 is the distance between the first projection 81A and the second transverse wall 85B, at rest, then:

$$L=L1+d1+d2.$$

The micro-electro-mechanical device 60 of FIG. 4 further comprises a second projection/abutment surface pair 83B between the second driving arm 72B and the tiltable structure 62; a third projection/abutment surface pair 83C between the third driving arm 72C and the tiltable structure 62; and a fourth projection/abutment surface pair 83D between the fourth driving arm 72D and the tiltable structure 62. The second, third and fourth projection/abutment surface pairs 83B-83C here have the same structure as the first projection/abutment surface pair 83A.

In use, the tiltable structure 62 may be rotated about the rotation axis B by simultaneously biasing the piezoelectric regions 73 of the first and third driving arms 72A, 72C to obtain a rotation in a first direction (as indicated by the arrow R1 in FIG. 4) and by simultaneously biasing the piezoelectric regions 73 of the second and fourth driving arms 72B, 72D to obtain a rotation in a second direction (as indicated by the arrow R2 in FIG. 4).

As described in United States Patent Application Publication No. 20200192199 (incorporated by reference) corresponding to Italian Patent Application No. 102018000011112 cited above, by biasing alternately and in sequence (for example, at a frequency linked to the vertical scan of the picoprojector 1 of FIG. 1) the piezoelectric regions 73 as indicated above, it is thus possible to obtain successive and alternating rotations of the tiltable structure 62 about the rotation axis B.

During the rotation movement of the tiltable structure 62, due to the position of the projection/abutment surface pairs 83A-83D, at least two of the projection/abutment surface pairs 83A-83D (the ones associated to the biased side of the piezoelectric regions 73) are active and, in case of undesired shocks or movements of the tiltable structure 62 parallel to the symmetry axis A, limit the degree thereof.

Figure 5A:
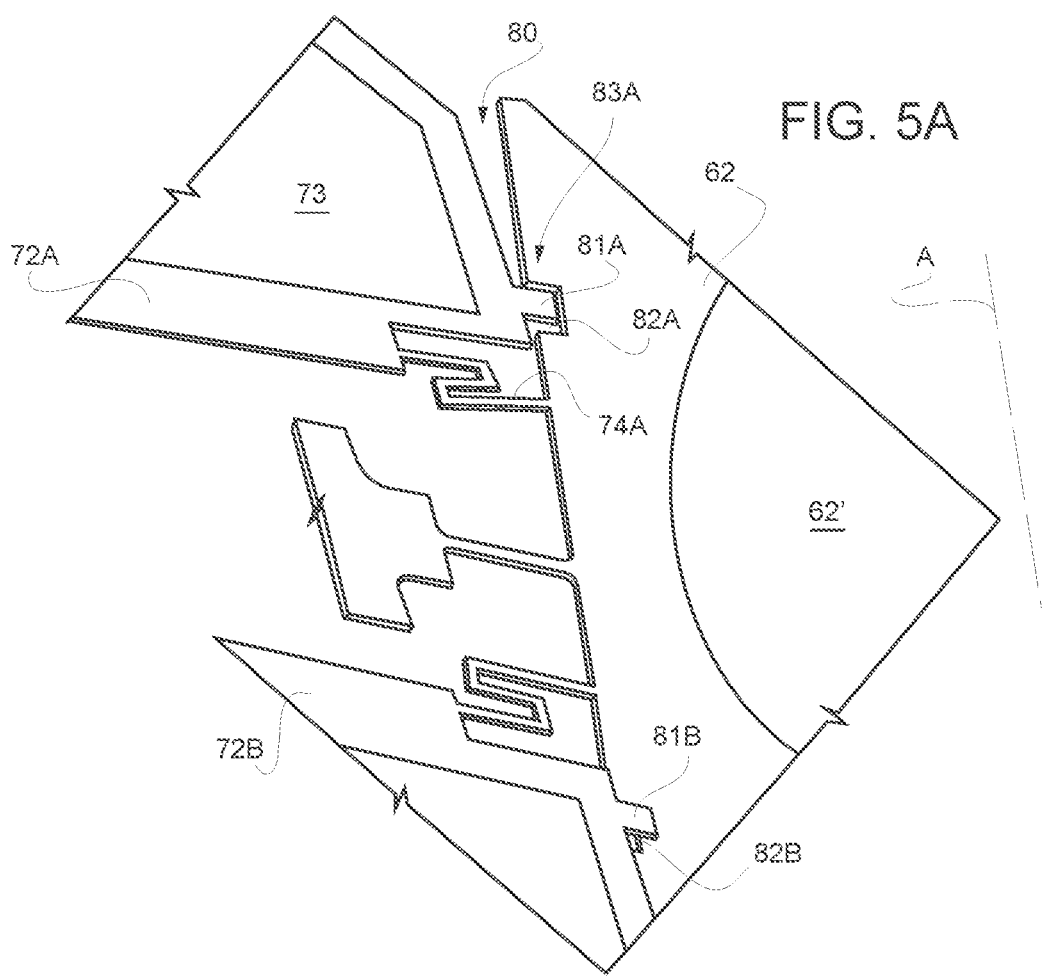
FIG. 5A is an enlarged perspective view of the detail of FIG. 5, in a different operating position.

For instance, FIG. 5A shows engagement of the projection/abutment surface pair 83A during the rotation of the tiltable structure 62 in the first direction (arrow R1 of FIG. 4) in presence of a wide rotation angle. This engagement ensures that, in the event of shock in a direction parallel to the symmetry axis A, the tiltable structure 62 can move for a distance d1 or d2 (depending on which way the impact acts) in this direction, preventing excessive stresses on the elastic suspension elements 66A, 66B and on the elastic decoupling elements 74A-74D.

Consequently, the actuation structure 70 has a high stiffness in the tiltable plane AB, not only along the rotation axis B but also along the symmetry axis A and, as a whole, the micro-electro-mechanical device 60 is robust in the planar direction.

According to another aspect of the present description, the micro-electro-mechanical device 60 has a vertical stop structure 90 (perpendicular to the tiltable plane AB of the tiltable structure 62, parallel to the third Cartesian axis Z in a rest condition of the tiltable structure 62).

In detail, with reference to FIGS. 5 and 6, the vertical stop structure 90 comprises stop pillars 91 cooperating with a rear stop surface 92.

In detail, the stop pillars 91 project from the rear side of the driving arms 72A-72D toward the inside of the cavity 63 and are rigid with the driving arms 72A-72D. For instance, the vertical stop structure 90 may comprise four stop pillars 91, one for each driving arm 72A-72D, arranged (as represented with a dashed line in FIG. 5 for the first driving arm 72A) in proximity of the minor base 80 of the trapezoidal shape of the driving arm.

The rear stop surface 92 is formed by a cap structure 93 illustrated in FIG. 6. As may be noted from this figure, the cavity 63 is closed at the rear by a substantially parallelepipedal body, for example, of semiconductor material, forming the cap structure 93. In particular, the cap structure 93 has a top surface facing the cavity 63 forming the rear stop surface 92 and is bonded to the frame 64' of the fixed structure 64 through an adhesive layer 95, for example, of silicon oxide or polymeric material. A recess 96, facing the cavity 63, is formed in the cap structure 93 and extends towards the inside thereof, from the rear stop surface 92, underneath the tiltable structure 62, for enabling free rotation of the latter in use.

As may be noted from FIG. 6, the stop pillars 91 have such a height that their bottom ends, which are free, are arranged at a certain distance from the rear stop surface 92. The stop pillars 91 thus enable free rotation of the inner ends of the driving arms 72A-72D, and therefore of the tiltable structure 62, during the actuation movement, but limit the vertical movement of the inner ends of the driving arms 72A-72D in the event of shocks directed out of the plane.

As shown once again in FIG. 6 and as has described in United States Patent Application Publication No. 20200192199 (incorporated by reference) corresponding to Italian Patent Application No. 102018000011112 cited above, the tiltable structure 62 has reinforcement elements 94, which extend parallel to the third Cartesian axis Z towards the recess 96. The reinforcement elements 94 are rigid with the tiltable structure 62 and have the function of mechanical reinforcement for the latter.

In the illustrated embodiment, the reinforcement elements 94 and the stop pillars 91 have the same height (in a direction parallel to the third Cartesian axis Z) and may be formed simultaneously. For instance, in the illustrated embodiment, where the fixed structure 64, the tiltable structure 62, and the elastic elements 74A-74D and 66A, 66B are manufactured monolithically in a structural layer or a wafer of semiconductor material, the reinforcement elements 94 and the stop pillars 91 may be formed simultaneously by deep etching the structural layer or wafer to form the cavity 63.

In this case, the reinforcement elements 94 and the stop pillars 91 may have the same height as the structural layer or wafer forming the structures 62, 64 and the elastic elements 74A-74D and 66A, 66B, and the distance between the stop pillars 91 and the rear stop surface 92 is equal to the thickness of the adhesive layer 95 and is, for example, comprised between 1 and 10 μm.

In this way, in the presence of shocks parallel to the third Cartesian axis Z (so-called "out-of-plane direction") downward (i.e., toward the cap structure 93, first vertical direction W1 in FIG. 6), due also to the stiffness of the elastic decoupling elements 74A-74D regarding out-of-plane movements, the movement of the ends of the driving arms 72A-72D, and therefore of the tiltable structure 62, is limited to a value equal to the thickness of the adhesive layer 95, notwithstanding the high compliance of the actuation structure 70 in the out-of-plane direction.

Figure 8:
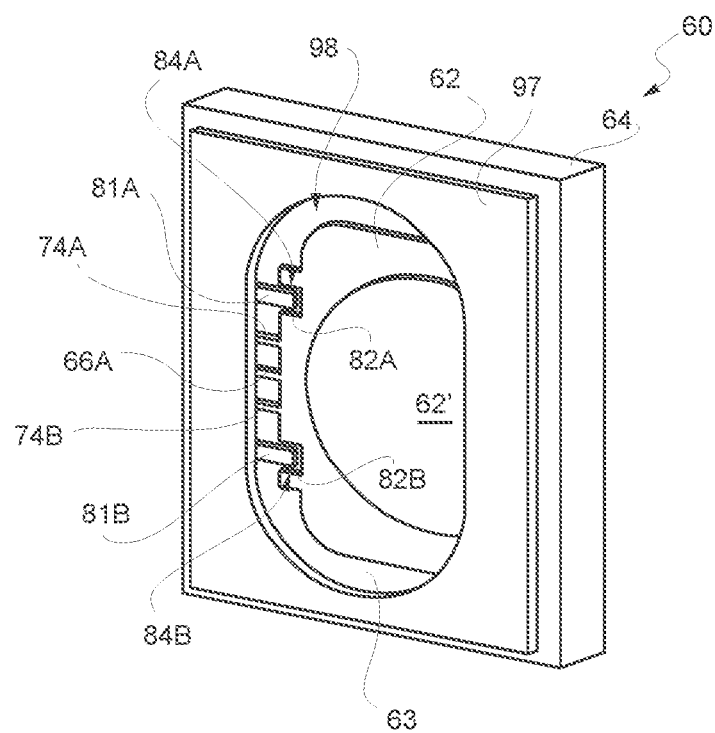
FIG. 8 is a perspective view of the device of FIG. 7.

FIGS. 7 and 8 show a different embodiment wherein the vertical stop structure 90 also comprises stop elements active in case of shocks directed opposite to the first vertical direction W1.

In detail, in FIGS. 7 and 8, the micro-electro-mechanical device 60 has a front die 97 coupled to the fixed structure 64 and provided with a light passage opening 98 at the reflecting surface 62'. For instance, the front die 97 may be formed by a semiconductor material wafer or other material opaque to light, for limiting the radiation entering/leaving the micro-electro-mechanical device 60, and the light passage opening 98 may be concentric to the tiltable structure 62 and have a greater area than the latter.

The front die 97 may be fixed to the fixed structure 64 by connection elements 99, for example formed by a plurality of fixing pillars, having an elongated shape, that have a first end fixed to the frame 64' and a second, opposite, end fixed to the front die 97. Two fixing pillars 99 arranged in the drawing plane and two fixing pillars 99 (represented by dashed lines) arranged at the back with respect to the drawing plane are visible in FIG. 7.

As an alternative thereto, the connection structure may be formed by a peripheral wall belonging to a front cap structure extending along the entire periphery of the front die 97.

In both cases, the bottom surface of the front die 97, facing the driving arms 72A-72D, forms, in proximity of the edge of the light passage opening 98, an abutment area for the inner ends of the driving arms 72A-72D; this abutment area, in presence of shocks upwards, parallel to the third Cartesian axis Z, vertical direction W2 of FIG. 7, limits movement thereof in said direction.

The micro-electro-mechanical device 60 may therefore be used in a picoprojector 101 adapted to be functionally coupled to a portable electronic apparatus 100, as described hereinafter with reference to FIGS. 8-10.

In detail, the pico-projector 101 of FIG. 8 comprises a light source 102, for example a laser source, for generating a light beam 103; the micro-electro-mechanical device 60, for receiving the light beam 103 and directing it toward a screen or display surface 105 (external to and arranged at a distance from the pico-projector 101); a first driving circuit 106, for supplying suitable control signals to the light source 102, for generating the light beam 103 as a function of an image to be projected; a second driving circuit 108, for supplying control signals to biasing-voltage generators 76, 77 for actuating the micro-electro-mechanical device 60; and a communication interface 109, for receiving, from an external control unit 110, for example included in the portable apparatus 100 (FIGS. 9 and 10), information on the image to be generated, for example in the form of a pixel array. This information is input for driving the light source 102.

Figure 9:
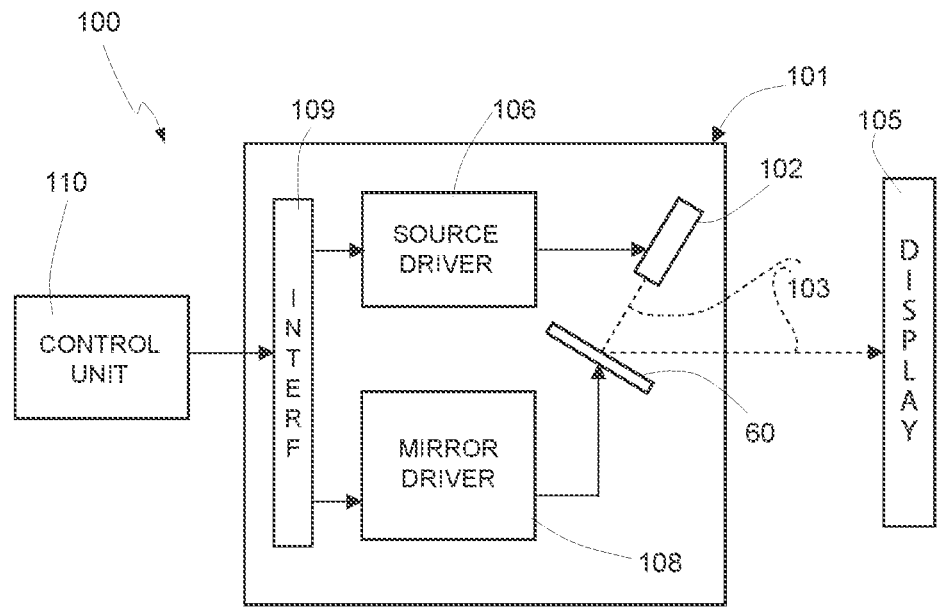
FIG. 9 is a block diagram of a picoprojector using the micro-electro-mechanical device described and disclosed herein.

The pico-projector 101 may be manufactured as separate and stand-alone accessory with respect to an associated portable electronic apparatus 100, for example a mobile phone or smartphone, as illustrated in FIG. 9. In this case, the pico-projector 101 is coupled to the portable electronic apparatus 100 by suitable electrical and mechanical connection elements (not illustrated in detail). Here, the pico-projector 101 has its own casing 131, which has at least one portion 131' transparent to the light beam 103 from the micro-electro-mechanical device 60; the casing 131 of the pico-projector 1 is coupled in a releasable way to a respective casing 132 of the portable electronic apparatus 100.

Figure 10:
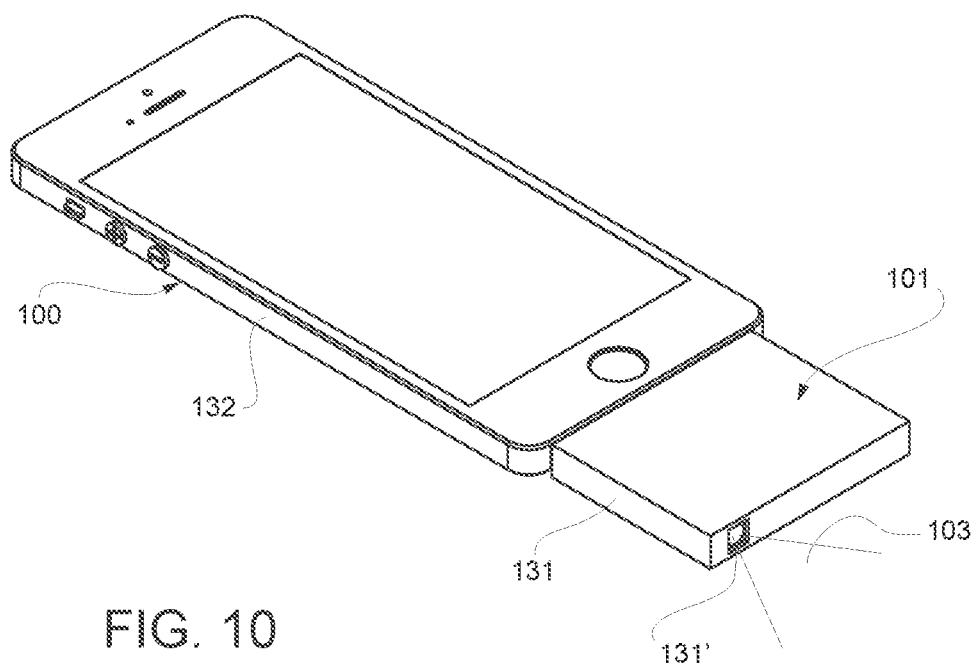
FIGS. 10 and 11 are perspective views of different coupling possibilities between the picoprojector of FIG. 9 and a portable electronic apparatus.

Alternatively, as illustrated in FIG. 10, the pico-projector 101 may be integrated within the portable electronic apparatus 100 and be arranged within the casing 132 of the portable electronic apparatus 100. In this case, the portable electronic apparatus 100 has a respective portion 132' transparent to the light beam 103 from the micro-electro-mechanical device 60. In this case, the pico-projector 101 is coupled, for example, to a printed circuit board in the casing 132 of the portable electronic apparatus 100.

Figure 11:
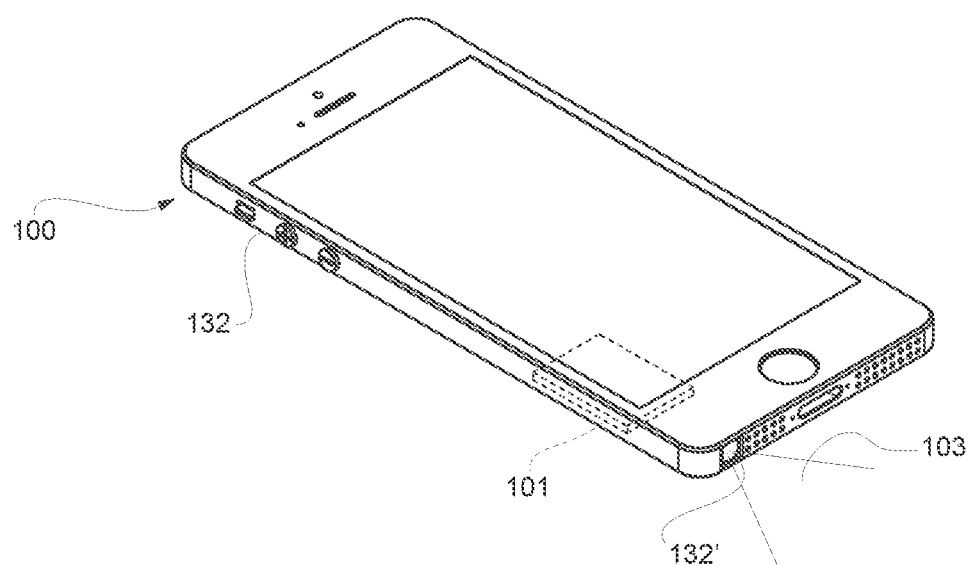
Figure 12:
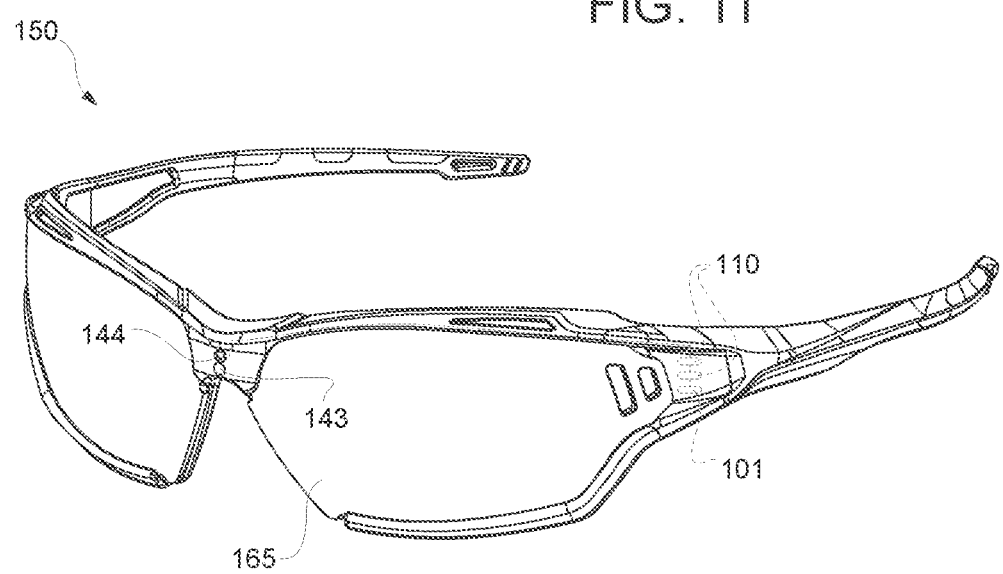
FIG. 12 is a perspective view regarding a coupling possibility between the picoprojector of FIG. 9 and an enhanced-reality viewing system.

In another embodiment, the micro-electro-mechanical device 60 may also be integrated in a viewer 150 configured to be worn by a user at a close distance from his eyes and for projecting images for enhanced or virtual reality, as illustrated in FIG. 11. In detail, the viewer 150 here comprises sensors 143, 144 able, for example, of recording both the reality external to the user and movements of the user, such as movements of his hands or gaze. The information gathered by the sensors 143, 144 may be processed by a processing unit 160 and by the control unit 110, for projecting images specific for the desired application on a lens 165 of the viewer 150.

The advantages obtainable with the described micro-electro-mechanical device 60 are evident from the foregoing.

In particular, it is emphasized that, thanks to coupling of the stop structures to the actuation structure 70, the stop structures are operative also in the rotated condition of the tiltable structure 62 so that the micro-electro-mechanical device 60 has high robustness.

Finally, it is clear that modifications and variations may be made to the micro-electro-mechanical device described and illustrated herein, without thereby departing from the scope of this disclosure, as defined in the attached claims.

For instance, even though the illustrated embodiment refers to a micromirror that may be actuated for performing a slow vertical scan with linear or quasi-static movement, the micro-electro-mechanical device is not limited thereto, but may form a micromirror device with low-frequency resonant movement or a device of a different, non-optical, type having a piezoelectrically driven, and elastically suspended tiltable structure, the displacements of which are to be limited in a direction perpendicular to the rotation axis.

Moreover, as mentioned, the projections 81A-81D and the recesses 82A-82D may be switched around; likewise, the stop pillars 91 may be made to project from the cap structure 93, instead of from the driving arms 72A-72D.

The recesses 82A-82D may be replaced by simple abutment walls; in this case, to limit the in-plane movement perpendicular to the rotation axis B in both directions, the transverse walls may be arranged symmetrically to the rotation axis B, and/or a first transverse wall may be provided for a given actuation arm (for example, the first wall 84A for the first projection/abutment surface pair 83A) and a second transverse wall may be provided for an actuation arm of the same pair (in the example considered above, the second transverse wall 85A of the third projection/abutment surface pair 83C).

In some applications, the light passage opening 98 may be formed by a region transparent to electromagnetic radiation in the frequency range of interest.

The invention claimed is:

1. A microelectromechanical systems (MEMS) device, comprising:
 a tiltable structure having a main extension in a tiltable plane, parallel to an XY plane of a Cartesian reference system having an X axis, a Y axis, and a Z axis;
 a fixed supporting structure having a cavity over which the tiltable structure is suspended;
 at least one elastic decoupling element connecting the tiltable structure to a first driving arm;
 an actuation structure formed by a plurality of driving arms coupled to the tiltable structure by respective elastic decoupling elements; and
 a vertical stop structure perpendicular to the tiltable plane and parallel to the Z axis in a rest condition of the tiltable structure, the vertical stop structure comprising a plurality of stop pillars cooperating with a rear stop surface to thereby permit free rotation of inner ends of the plurality of driving arms during actuation but limit vertical movement of the inner ends of the plurality of driving arms resulting from mechanical shock, wherein the plurality of stop pillars extend from a rear side of the driving arms of the plurality of driving arms into the cavity.

2. The MEMS device according to claim 1, wherein the elastic decoupling elements are rigid to movements out of the tiltable plane and compliant to torsion about the rotation axis.

3. A microelectromechanical systems (MEMS) device, comprising:
 a tiltable structure having a main extension in a tiltable plane, parallel to an XY plane of a Cartesian reference system having an X axis, a Y axis, and a Z axis;
 a fixed supporting structure having a cavity over which the tiltable structure is suspended;
 at least one elastic decoupling element connecting the tiltable structure to a first driving arm;
 an actuation structure formed by a plurality of driving arms coupled to the tiltable structure by respective elastic decoupling elements; and
 a vertical stop structure perpendicular to the tiltable plane and parallel to the Z axis in a rest condition of the tiltable structure, the vertical stop structure comprising a plurality of stop pillars cooperating with a rear stop surface to thereby permit free rotation of inner ends of the plurality of driving arms during actuation but limit vertical movement of the inner ends of the plurality of driving arms resulting from mechanical shock;
 wherein the plurality of stop pillars comprise first, second, third, and fourth stop pillars, each projecting from a rear side of a respective one of the plurality of driving arms toward an inside of the cavity and being rigid with its driving arm.

4. The MEMS device according to claim 3, wherein the rear stop surface is formed by a cap structure bonded to the fixed supporting structure through an adhesive layer.

5. The MEMS device according to claim 4, wherein the tiltable structure has reinforcement elements extending parallel to the Z axis toward a recess formed in the cap structure.

6. The MEMS device according to claim 5, wherein the reinforcement elements and the plurality of stop pillars have a same height in a direction parallel to the Z axis.

7. The MEMS device according to claim 3, wherein the elastic decoupling elements are rigid to movements out of the tiltable plane and compliant to torsion about the rotation axis.

8. A microelectromechanical systems (MEMS) device, comprising:
a tiltable structure having a main extension in a tiltable plane, parallel to an XY plane of a Cartesian reference system having an X axis, a Y axis, and a Z axis;
a fixed supporting structure having a cavity over which the tiltable structure is suspended;
at least one elastic decoupling element connecting the tiltable structure to a first driving arm;
an actuation structure formed by a plurality of driving arms coupled to the tiltable structure by respective elastic decoupling elements; and
a vertical stop structure perpendicular to the tiltable plane and parallel to the Z axis in a rest condition of the tiltable structure, the vertical stop structure comprising a plurality of stop pillars cooperating with a rear stop surface to thereby permit free rotation of inner ends of the plurality of driving arms during actuation but limit vertical movement of the inner ends of the plurality of driving arms resulting from mechanical shock;
a planar stop structure arranged between the plurality of driving arms and the tiltable structure and configured to limit movement of the tiltable structure in the tiltable plane in a direction perpendicular to a rotation axis, parallel to the X axis and belonging to the tiltable plane;
wherein the planar stop structure comprises a first projection/abutment surface pair formed by a first projection extending from a first of the plurality of driving arms and a first abutment surface formed by a first recess extending from a periphery of the tiltable structure toward an inside thereof, with a free end of the first projection extending within the first recess; and
wherein the first projection and the first abutment surface extend in a direction transverse to a symmetry axis, parallel to the Y axis and are arranged adjacent and side-by-side to one another, and which are arranged, in a rest condition of the MEMS device, at a distance from each other.

9. The MEMS device according to claim 8, wherein the planar stop structure further comprises:
a second projection/abutment surface pair between a second of the plurality of driving arms and the tiltable structure;
a third projection/abutment surface pair between a third of the plurality of driving arms and the tiltable structure; and
a fourth projection/abutment surface pair between a second of the plurality of driving arms and the tiltable structure.

10. The MEMS device according to claim 9,
wherein the tiltable structure is configured to be rotated about the rotation axis during operation as a result of successively alternating biasing of piezoelectric regions of the first and third driving arms to obtain a rotation in a first direction and biasing piezoelectric regions of the second and fourth driving arms to obtain a rotation in a second direction;
wherein, during the rotation of the tiltable structure about the rotation axis due to biasing of the piezoelectric regions of the first and third driving arms as a result of positioning of the first and third projection/abutment surface pairs movement of the tiltable structure parallel to the symmetry axis is limited; and
wherein, during the rotation of the tiltable structure about the rotation axis due to biasing of the piezoelectric regions of the second and fourth driving arms as a result of positioning of the second and fourth projection/abutment surface pairs movement of the tiltable structure parallel to the symmetry axis is limited.

11. The MEMS device according to claim 8, wherein the first projection extends from a driving arm toward the tiltable structure and has a width along the Y axis smaller than a distance between first and second transverse walls of the recess.

12. The MEMS device according to claim 8, wherein the planar stop structure further comprises a second pair of planar stop structures formed by a second projection and a second abutment surface.

13. The MEMS device according to claim 8, wherein the elastic decoupling elements are rigid to movements out of the tiltable plane and compliant to torsion about the rotation axis.

14. A microelectromechanical systems (MEMS) device, comprising:
a tiltable structure having a main extension in a tiltable plane, parallel to an XY plane of a Cartesian reference system having an X axis, a Y axis, and a Z axis;
a fixed supporting structure having a cavity over which the tiltable structure is suspended;
at least one elastic decoupling element connecting the tiltable structure to a first driving arm;
an actuation structure formed by a plurality of driving arms coupled to the tiltable structure by respective elastic decoupling elements; and
a vertical stop structure perpendicular to the tiltable plane and parallel to the Z axis in a rest condition of the tiltable structure, the vertical stop structure comprising a plurality of stop pillars cooperating with a rear stop surface to thereby permit free rotation of inner ends of the plurality of driving arms during actuation but limit vertical movement of the inner ends of the plurality of driving arms resulting from mechanical shock;
wherein the first driving arm carries a respective piezoelectric region, and the device further comprises a plurality of electrical-contact pads carried by the fixed structure and electrically connected to the piezoelectric region carried by the first driving arm to enable electrical biasing thereof by electrical signals from outside the MEMS device.

15. The MEMS device according to claim 14, wherein the elastic decoupling elements are rigid to movements out of the tiltable plane and compliant to torsion about the rotation axis.

16. A microelectromechanical systems (MEMS) device, comprising:
a tiltable structure formed in a die of semiconductor material and suspended over a cavity defined in the die, the tiltable structure having a main extension in a tiltable plane and carrying a reflecting surface;
a fixed structure comprising a frame, the tiltable structure being elastically coupled to the frame via supporting elements and elastic suspension elements, wherein the supporting elements extend longitudinally along a rotation axis on opposite sides of the tiltable structure, and the elastic suspension elements extend between a respective suspension element and the tiltable structure;

an actuation structure comprising first, second, third, and fourth driving arms coupled to the tiltable structure by respective elastic decoupling elements, wherein the first and second driving arms form a first pair of driving arms arranged on opposite sides of the rotation axis, and the third and fourth driving arms form a second pair of driving arms arranged on opposite sides of the rotation axis symmetrically to the first pair of driving arms with respect to a symmetry axis;

a piezoelectric region carried by each driving arm configured to be biased by one or more electrical signals from outside the MEMS device; and a planar stop structure arranged between the driving arms and the tiltable structure for limiting movement of the tiltable structure in the tiltable plane in a direction perpendicular to the rotation axis.

17. The MEMS device of claim 16, wherein the planar stop structure comprises at a first pair of stop features, wherein a first element of the first pair of stop features projects from or is fixed to a respective one of the first, second, third, and fourth driving arms and the other element of the first pair of stop features is fixed to or projects from the tiltable structure.

18. The MEMS device of claim 17, wherein the first pair of stop features comprises a first projection extending from the first driving arm and a first abutment surface formed by a recess defined in the tiltable structure, the first projection extending within the first recess, the first recess being defined by first and second transverse walls parallel to the rotation axis and spaced from each other by a gap sufficient to allow movement between the first projection and the first recess along the symmetry axis.

19. The MEMS device of claim 18, wherein the first projection and the first transverse wall are arranged at a distance d1, and the first projection and the second transverse wall are arranged at a distance d2, in a rest condition of the tiltable structure; and wherein a distance L between the first and second transverse walls is defined as:

$L=L1+d1+d2$, with L1 being a width of the first projection.

20. The MEMS device of claim 16, wherein the elastic suspension elements comprise straight springs formed by thinned portions of the supporting elements.

21. The MEMS device of claim 16, wherein each driving arm has a generically trapezial shape, with a major base fixedly coupled to the frame of the fixed structure and a minor base elastically coupled to the tiltable structure.

* * * * *